(12) United States Patent
Svelnis et al.

(10) Patent No.: US 11,532,903 B2
(45) Date of Patent: Dec. 20, 2022

(54) UNIVERSAL ELECTRICAL CONNECTOR

(71) Applicant: IDEAL Industries, Inc., Sycamore, IL (US)

(72) Inventors: Christine Mary Svelnis, Boylston, MA (US); Richard Scott Horner, Marlborough, MA (US); David Scott Beach, Oxford, MA (US); Daniel Keith Gruenemeier, Scottsdale, AZ (US)

(73) Assignee: IDEAL Industries, Inc., Sycamore, IL (US)

( * ) Notice: Subject to any disclaimer, the term of this patent is extended or adjusted under 35 U.S.C. 154(b) by 0 days.

(21) Appl. No.: 17/220,454

(22) Filed: Apr. 1, 2021

(65) Prior Publication Data
US 2022/0320769 A1    Oct. 6, 2022

(51) Int. Cl.
*H01R 12/71*     (2011.01)
*H01R 13/627*    (2006.01)
*H01R 13/621*    (2006.01)

(52) U.S. Cl.
CPC ........... *H01R 12/71* (2013.01); *H01R 13/621* (2013.01); *H01R 13/6271* (2013.01)

(58) Field of Classification Search
None
See application file for complete search history.

(56) References Cited

U.S. PATENT DOCUMENTS

| | | | |
|---|---|---|---|
| 6,948,949 B1 * | 9/2005 | Schwartz | H01R 9/2491 439/76.1 |
| 7,585,176 B2 * | 9/2009 | Chen | H01R 31/005 439/639 |
| 7,841,909 B2 * | 11/2010 | Murray | H01R 13/6461 439/676 |

* cited by examiner

Primary Examiner — Ross N Gushi
(74) Attorney, Agent, or Firm — Greenberg Traurig, LLP

(57) ABSTRACT

An electrical connector includes a universal plug body, a plurality of electrical contacts disposed in the universal plug body, and a printed circuit board (PCB), coupled with the universal plug, comprising a plurality of electrically-conductive features configured to electrically connect the plurality of electrical contacts to a plurality of terminals. Different PCB types may be used with the universal plug body to accommodate different power and data applications with a universal connector body.

17 Claims, 9 Drawing Sheets

UNIVERSAL ELECTRICAL CONNECTOR

FIELD OF THE DISCLOSURE

The present description relates generally to electrical connectors, methods for assembling electrical connectors, and more particularly to a universal electrical connector for multiple different input power types.

BACKGROUND OF RELATED ART

Electrical connector systems generally include different connector shapes, sizes, and form factors for different applications.

SUMMARY

In a first aspect of the present disclosure, an electrical connector is provided. The electrical connector includes a universal plug body, a plurality of electrical contacts disposed in the universal plug body, and a printed circuit board (PCB), coupled with the universal plug body, comprising a plurality of electrically-conductive features configured to electrically connect the plurality of electrical contacts to a plurality of terminals.

In an embodiment of the first aspect, the PCB is a PCB type selected from a plurality of PCB types, each PCB type including a respective plurality of electrically-conductive features configured to electrically connect the plurality of electrical contacts to a respective plurality of terminals, wherein each PCB type includes a different quantity or layout of terminals from each other PCB type.

In an embodiment of the first aspect, the connector further includes the plurality of terminals, electrically coupled to the electrically-conductive features of the PCB.

In an embodiment of the first aspect, the electrically-conductive features electrically couple a first one of the terminals to a first two or more of the electrical contacts.

In an embodiment of the first aspect, the electrically-conductive features electrically couple a second one of the terminals to a second two or more of the electrical contacts, and/or the electrically-conductive features electrically couple a second one of the terminals to one of the electrical contacts that is not in the two or more electrical contacts.

In an embodiment of the first aspect, the connector further includes an electrically-insulative cover coupled to the PCB, wherein the electrical contacts are coupled to the PCB at a first side of the PCB and the cover is coupled to a second side of the PCB that is opposite the first side.

In an embodiment of the first aspect, the connector further includes a ground electrical contact, disposed in the universal plug body, that is not in electrical contact with the PCB.

In an embodiment of the first aspect, the connector further includes a fastener, disposed on an external surface of the connector, for affixing the connector to a mating connector.

In an embodiment of the first aspect, each electrical contact is disposed in a respective C-shaped recess in the plug body.

In a second aspect of the present disclosure, a method of assembling an electrical connector is provided. The method includes providing a universal plug body and inserting a plurality of electrical contacts into the plug body. The method further includes selecting a printed circuit board (PCB) from a plurality PCB of a plurality of PCB types, each PCB type including a respective plurality of electrically-conductive features configured to electrically connect the plurality of electrical contacts to a respective plurality of terminals, wherein each PCB type comprises a different quantity or layout of terminals from each other PCB type. The method further includes coupling the plurality of electrical contacts with the electrically-conductive features of the selected PCB.

In an embodiment of the second aspect, the method further includes coupling the plurality of terminals to the electrically-conductive features of the PCB.

In an embodiment of the second aspect, the electrically-conductive features electrically couple a single one of the terminals to two or more of the electrical contacts.

In an embodiment of the second aspect, the electrically-conductive features electrically couple a second one of the terminals to a second two or more of the electrical contacts, and/or the electrically-conductive features electrically couple a second one of the terminals to one of the electrical contacts that is not in the two or more electrical contacts.

In an embodiment of the second aspect, the method further includes coupling an electrically-insulative cover to the PCB, wherein the electrical contacts are coupled to the PCB at a first side of the PCB and the cover is coupled to a second side of the PCB that is opposite the first side.

In an embodiment of the second aspect, the method further includes inserting a ground electrical contact into the plug body, wherein the ground electrical contact is not placed in electrical contact with the PCB and coupling a ground wire with the ground electrical contact.

In a third aspect of the present disclosure, a universal electrical connector system is provided. The electrical connector system includes a first connector including a first plug body, a first plurality of electrical contacts disposed in the first plug body, and a first printed circuit board (PCB), coupled with the first plurality of electrical contacts, that includes a first plurality of electrically-conductive features configured to electrically connect the first plurality of electrical contacts to a first plurality of terminals. The electrical connector system further includes a second connector including a second plug body that is identical to the first plug body, a second plurality of electrical contacts disposed in the second plug body, and a second PCB, coupled with the second plurality of electrical contacts, comprising a second plurality of electrically-conductive features configured to electrically connect the second plurality of electrical contacts to a second plurality of terminals. The second plurality of terminals is different in number than the first plurality of terminals, and/or the second plurality of electrically-conductive features is different in configuration than the first plurality of electrically-conductive features.

In an embodiment of the third aspect, the system further includes a mating universal connector, configured to mate, separately, with both the first universal connector and the second universal connector.

In an embodiment of the third aspect, the mating universal connector is configured to be secured, separately, to the first universal connector and the second universal connector with one or more captive screws or an integrated latch.

In an embodiment of the third aspect, each of the first plug body and the second plug body comprises a respective plurality of C-shaped recesses, wherein each of the first and second plurality of electrical contacts is disposed in a respective C-shaped recess.

In an embodiment of the third aspect, the system further includes a third connector including a third plug body that is identical to the first plug body, a third plurality of electrical contacts disposed in the third plug body, and a third PCB, coupled with the third plurality of electrical contacts, comprising a third plurality of electrically-conductive features configured to electrically connect the third plurality of electrical contacts to a third plurality of terminals. The third plurality of terminals is different in number than the first and second pluralities of terminals, and/or the third plurality of electrically-conductive features is different in configuration than the first and second pluralities of electrically-conductive features.

DETAILED DESCRIPTION

The following description of example methods and apparatus is not intended to limit the scope of the description to the precise form or forms detailed herein. Instead the following description is intended to be illustrative so that others may follow its teachings.

Figure 1:
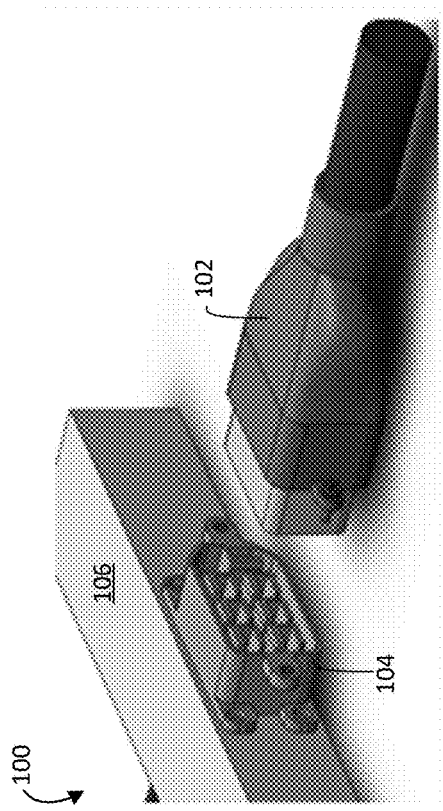
FIGS. 1 and 2 are perspective views of an example universal connector system.
Figure 2:
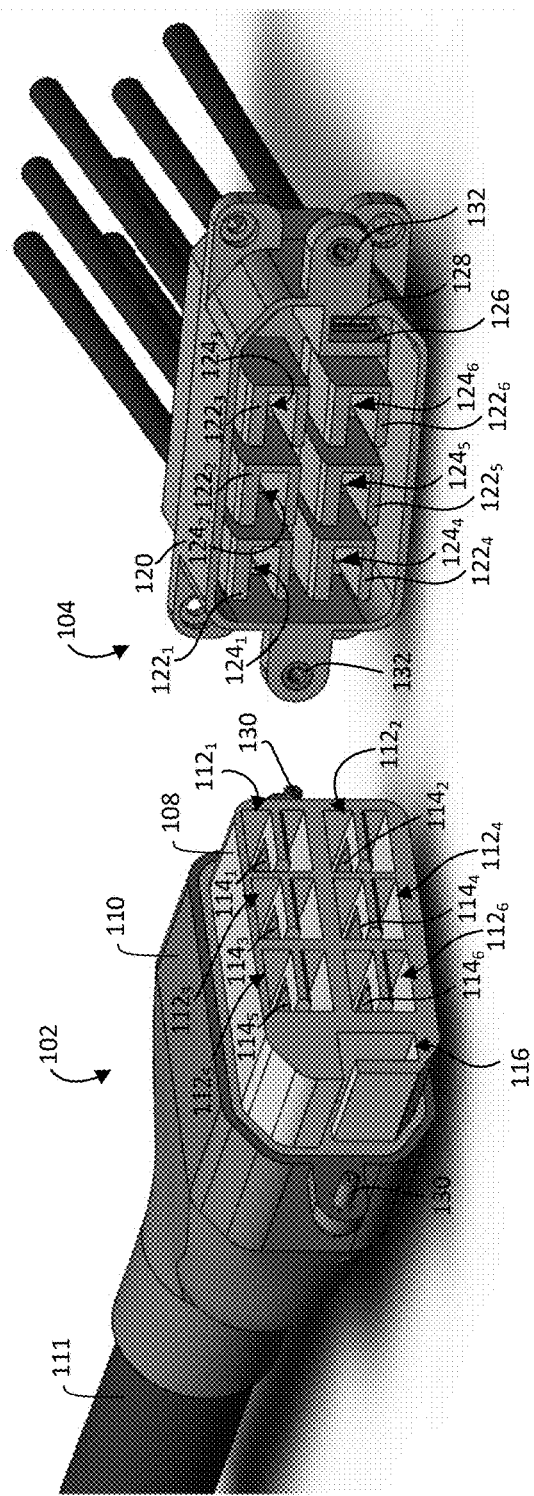
Figure 3:
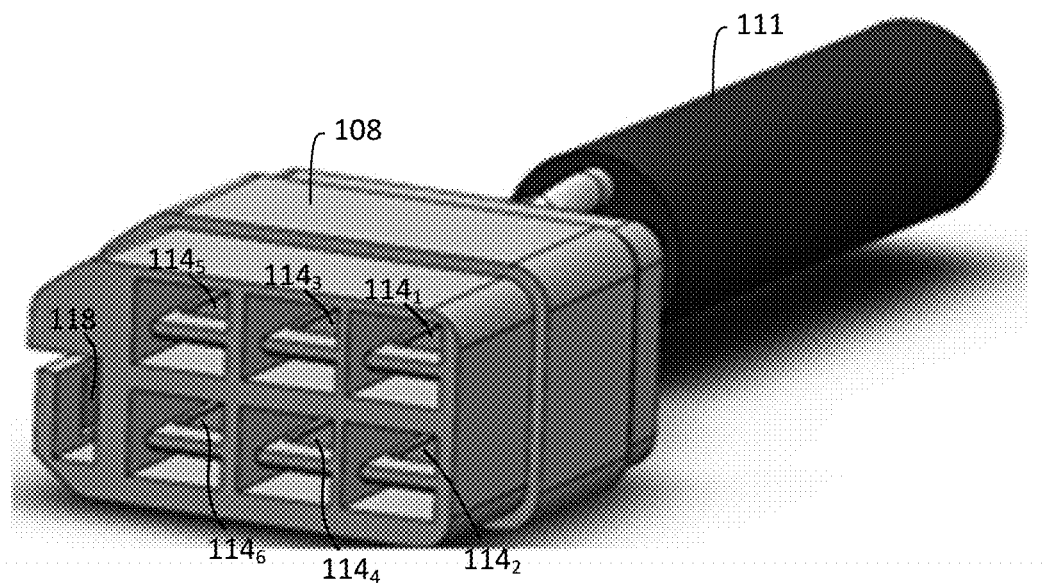
FIGS. 3 and 4 are perspective views of an example male universal connector assembly.
Figure 4:
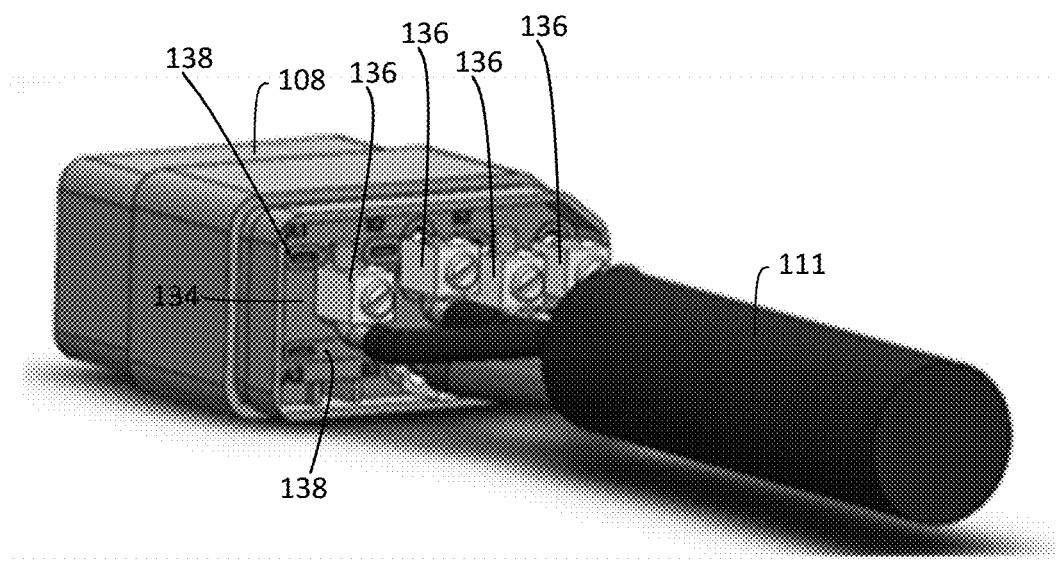

FIGS. 1 and 2 illustrate a universal connector system 100 that includes a male universal connector 102 and a female universal connector 104. FIGS. 3 and 4 are front and rear perspective views, respectively, of the male universal connector 102, with an overmold portion of the connector housing omitted. The connector system 100 may be used to connect a power distribution unit (PDU), uninterruptible power supply (UPS), or other electronic device 106 to an AC mains or other input power source, in some embodiments. In such embodiments, the female universal connector 104 may be disposed on or in a PDU, UPS, or other electronic device to receive input power. The male universal connector 102 may be coupled to a cable configured to transmit power from a power source. In some embodiments, the universal connectors 102, 104 may be used to transmit data from a second device to the electronic device 106. The universal connectors 102, 104 may be coupled together to provide power and/or a data connection to the electronic device 106. The electronic device 106 may be or may include one or more servers or server racks, in some embodiments.

The male connector 102 may include a plug body 108 and a connector housing 110. In some embodiments, the connector housing 110 may be or may include an overmold on the plug body 108 and a cable 111. The plug body 108 may include a plurality of recesses $112_1$, $112_2$, $112_3$, $112_4$, $112_5$, $112_6$ (which may be referred to individually as a recess 112 or collectively as the recesses 112) with a respective connector contact $114_1$, $114_2$, $114_3$, $114_4$, $114_5$, $114_6$ (which may be referred to individually as a contact 114 or collectively as the contacts 114) disposed in each recess 112. The recesses 112 may be generally C-shaped, in some embodiments. In such embodiments, the contact 114 may be disposed on an upper or lower surface of an internal projection within the recess 112.

The male connector plug body may further include a ground recess 116, including a connector contact 118 to be coupled to ground. The ground recess 116 and contact 118 may be disposed substantially perpendicular to each of the C-shaped recesses 112, in some embodiments.

The female connector 104 may include a plug body 120 configured to be affixed directly to the electronic device 106. The female connector plug body 120 may include a plurality of C-shaped protrusions $122_1$, $122_2$, $122_3$, $122_4$, $122_5$, $122_6$ configured to mate with the C-shaped recesses $112_1$, $112_2$, $112_3$, $112_4$, $112_5$, $112_6$ on the male connector 102. An electrical contact $124_1$, $124_2$, $124_3$, $124_4$, $124_5$, $124_6$ (each of which is labelled, but obscured by a protrusion, in FIG. 2) may be disposed on an upper or lower surface of each C-shaped protrusion 122 so as to connect to the electrical contacts 112 of the male connector 102 when the male and female connectors 102, 104 are mated to each other.

The female connector plug body 120 may further include a ground protrusion 126, including a connector contact 128 to be coupled to ground. The ground protrusion 126 and contact 128 may be disposed substantially perpendicular to each of the C-shaped protrusions 112, in some embodiments. The ground protrusion 126 and contact 128 may be configured to mate with the ground recess 116 and contact 118 of the male connector 102 when the male and female connectors 102, 104 are mated to each other.

One or more fasteners may be provided on the male connector and/or the female connector for securing the male and female connector 102, 104 to each other. For example, the male connector 102 may include two captive screws 130 on opposed external surfaces of the connector, and the female connector may include threaded apertures 132 for receiving the captive screws 130. In another embodiment, an integrated latch may be provided on opposed external surfaces of the plug body.

The system 100 of FIGS. 1 and 2 includes six contacts 114 on six C-shaped recesses 112 and six contacts 124 on six C-shaped protrusions 122, as well as a single ground contact 118, 128 on each connector 102, 104. In other embodiments, a different quantity of contacts 114, 124 may be provided, with a corresponding number of recesses 112 and protrusions 122. Further, while all recesses 112 and protrusions 122 (except for the ground recess 116 and protrusion 126) in the illustrated embodiment are the same size, shape, and orientation, in other embodiments, recesses may be different sizes, shapes, or orientations from each other, and protrusions may be different sizes, shapes, or orientations from each other.

Referring to FIG. 4, the male connector 102 may include a printed circuit board (PCB) 134 and a plurality of terminals 136 for coupling with input wires. The terminals 136 and the contacts 114 may be electrically coupled to each other by the PCB 134. Specifically, the PCB 134 may include a plurality of electrically-conductive features 138 (not all of which are labelled) to which the contacts 114 and terminals 136 may be electrically coupled. In some embodiments, each contact 114 may be electrically coupled to a single respective terminal 136 through the electrically-conductive features 138 of the PCB 134. In some embodiments, multiple contacts 114 may be coupled to a single terminal 136 through the electrically-conductive features 138 of the PCB 134. The electrically-conductive features 138 of the PCB 134 may include vias, pins, pads, wire traces, etc.

As shown in FIG. 4, the PCB 134 may be disposed within the plug body 108. In other embodiments, the PCB 134 may alternatively be disposed within another housing portion or body portion of the connector 102, such as an overmold portion.

The terminals 136 may include one or more lugs or other terminals structures, in embodiments. Each terminal 136 may provide a respective electrical contact point for a power or data wire.

The use of the electrically-conductive features 138 of the PCB 134 to connect terminals 136 to plug contacts 114 advantageously enables the use of the same form factor of the plug body 108, 120 to be used for many different input types. For example, the same plug body 108, 120 of FIGS. 1 and 2 may be used for DC power, single-phase AC power, 3-phase AC power, and/or one or more data signal lines. Accordingly, information technology and other computer hardware professionals and businesses can use a single plug form factor for a wide variety of applications.

Figure 5:
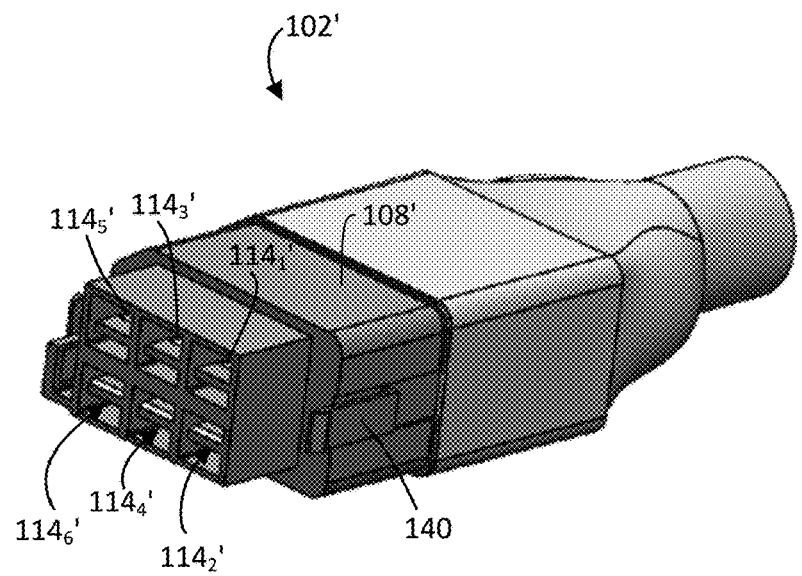
FIG. 5 is a perspective view of an example male universal connector.

FIG. 5 is a perspective view of a second embodiment of a male universal connector 102'. The male universal connector 102' is identical to the male universal connector 102 except as described herein. The male universal connector 102' includes connectors 114', with half of the connectors $114_2'$, $114_4'$, $114_6'$ disposed on a lower exposed surface of the C-shaped recess (and obscured in FIG. 5) and the other contacts $114_1'$, $114_3'$, $114_5'$ disposed on an upper exposed surface of the C-shaped recess. Further, the male universal connector 102' may include a integrated latch 140 or other fastener on opposed external surfaces of the plug body 108' for connection to a mating female connector.

Figure 6:
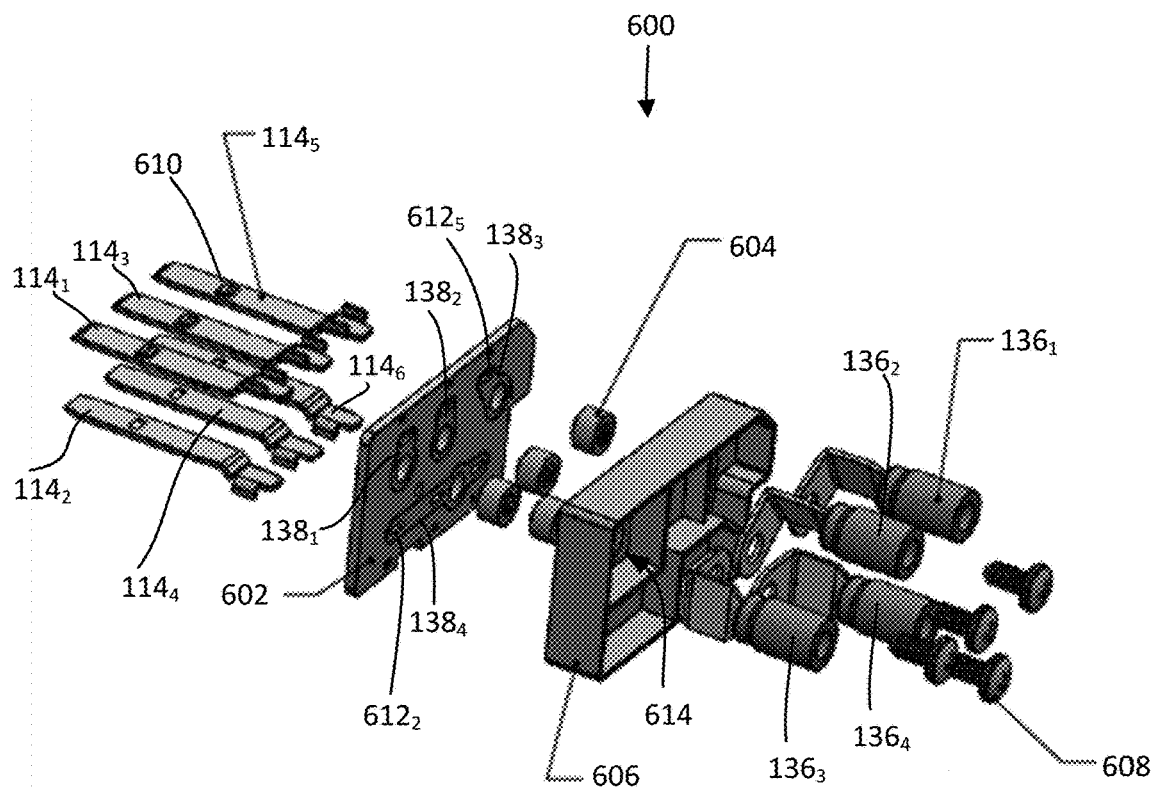
FIG. 6 is an exploded view of internal components of an example male universal connector.

FIG. 6 is an exploded view of an internal component assembly 600 of the male universal connector 102'. The assembly 600 includes a plurality (e.g., six) of plug contacts $114_1'$, $114_2'$, $114_3'$, $114_4'$, $114_5'$, $114_6'$, a PCB 602, a plurality of pad connectors 604 (one of which is indicated in FIG. 6), an electrically-insulative cover 606, a plurality of terminals $136_1$, $136_2$, $136_3$, $136_4$, and a plurality of fasteners 608 (one of which is indicated in FIG. 6).

As shown in FIG. 6, the plug contacts may be disposed in two or more orientations. For example, three plug contacts $114_1'$, $114_3'$, $114_5'$ may be disposed in a first orientation, and the other three plug contacts $114_2'$, $114_4'$, $114_6'$ may be disposed in a second orientation that is opposite (e.g., rotated 180 degrees from) the first orientation. In other embodiments, as shown in FIGS. 2 and 3, all plug contacts $114_1'$, $114_2'$, $114_3'$, $114_4'$, $114_5'$, $114_6'$ may be disposed in the same orientation. Further, although six plug contacts $114_1'$, $114_2'$, $114_3'$, $114_4'$, $114_5'$, $114_6'$ are shown, any number of plug contacts 114' may be provided, as needed for a particular form factor and application.

The plug contacts 114' of FIG. 6 include respective protrusions 610 (one of which is designated in FIG. 6) that may help secure the contact within the plug body 108', as will be described with respect to a similar "jog" feature with respect to FIG. 13 below.

The PCB 602 may include a plurality of electrically-conductive features 138. The PCB illustrated in FIG. 6 includes four sets of electrically conductive features $138_1$, $138_2$, $138_3$, $138_4$. The electrically-conductive features 138 include a first electrically conductive feature set $138_1$ that electrically couples one contact $114_1'$ to a first terminal location, a second electrically conductive feature set $138_2$ that electrically couples a second contact $114_3'$ to a second terminal location, a third electrically-conductive feature set $138_3$ that electrically couples a third contact $114_5'$ to a third terminal location, and a fourth electrically-conductive feature set $138_4$ that electrically couples the remaining three contacts $114_2'$, $114_4'$, $114_6'$ to a fourth terminal location. The PCB 602 may include a plurality of apertures 612 (two of which apertures $612_2$, $612_5$ are labelled), each for receiving a respective plug contact 114'. The plug contacts 114' may be inserted into a first side of the PCB 602 during assembly.

The pad connectors 604 may be provided to couple the terminal locations to respective terminals 136. The pad connectors 604 may be internally threaded, in some embodiments. The pad connectors 604 may be disposed on and electrically coupled to the terminal locations on the PCB 602. The pad connectors 604 may be electrically conductive.

The insulative cover 606 may be disposed on a second side of the PCB 602, opposite the plug contacts 114'. The insulative cover 606 may cover the entirety of the second side of the PCB 602. The insulative cover may include a plurality of apertures 614 (one of which is labelled in FIG. 6) through which the pad connectors 604 may extend.

The terminals 136 may be affixed to the pad connectors 604 with the fasteners 608. For example, the fasteners 608 may be screws and may be screwed into the pad connectors 604. Accordingly, the terminals 136 may be electrically coupled to the plug contacts 114' through the pad connectors 604 and through the electrically-conductive features 138 of the PCB 602.

The arrangement of FIG. 6, in which electrically-conductive features 138 of the PCB 602 connect terminals 136 to contacts 114', enables different PCB arrangements to be used for different terminal arrangements on the same plug and with the same configuration of plug contacts. FIGS. 7-13 illustrate several embodiments of PCBs with different numbers of input terminals. These different PCBs may be referred to herein as PCB types.

Figure 7:
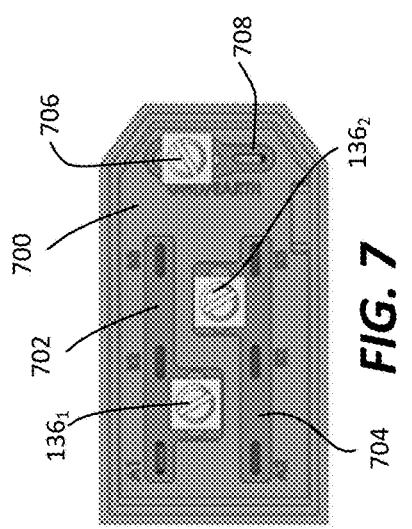
FIG. 7 is an end view of an example PCB assembly that may find use in a universal connector.
Figure 8:
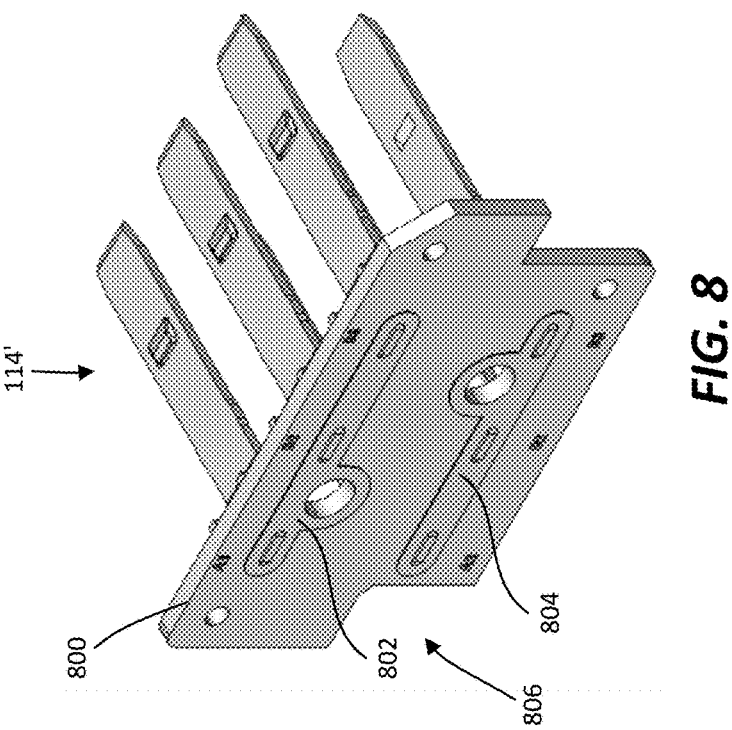
FIG. 8 is a perspective view of an example PCB assembly that may find use in a universal connector.

FIGS. 7 and 8 illustrate first and second embodiments 700, 800 of a PCB type for two-terminal input. Both embodiments 700, 800 of the two-terminal PCB type are configured to be electrically coupled to six contacts 114 or 114' and two power or data terminals 136. Each embodiment 700, 800 of the two-terminal PCB type includes a first electrically conductive feature set 702, 802 that electrically couples three contacts 114, 114' to a first terminal $136_1$, and a second electrically conductive feature set 704, 804 that electrically couples the other three contacts 114, 114' to a second terminal $136_2$. The first two-terminal type PCB 700 further includes a contact (not shown in FIG. 7), terminal 706, and electrically-conductive features 708 for ground. In contrast, the second two-terminal type PCB 800 includes a cutout 806 on the PCB. A ground wire, contact, or other ground connection may bypass the PCB through the cutout 806.

Figure 9:
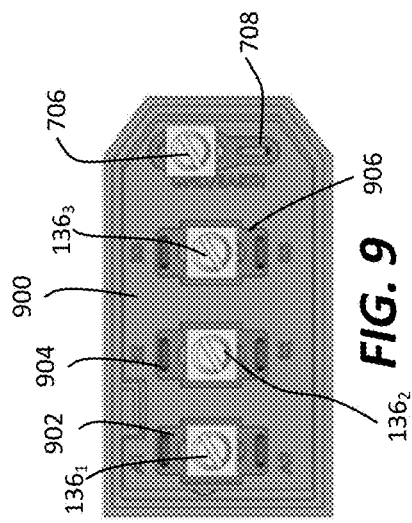
FIG. 9 is an end view of an example PCB assembly that may find use in a universal connector.
Figure 10:
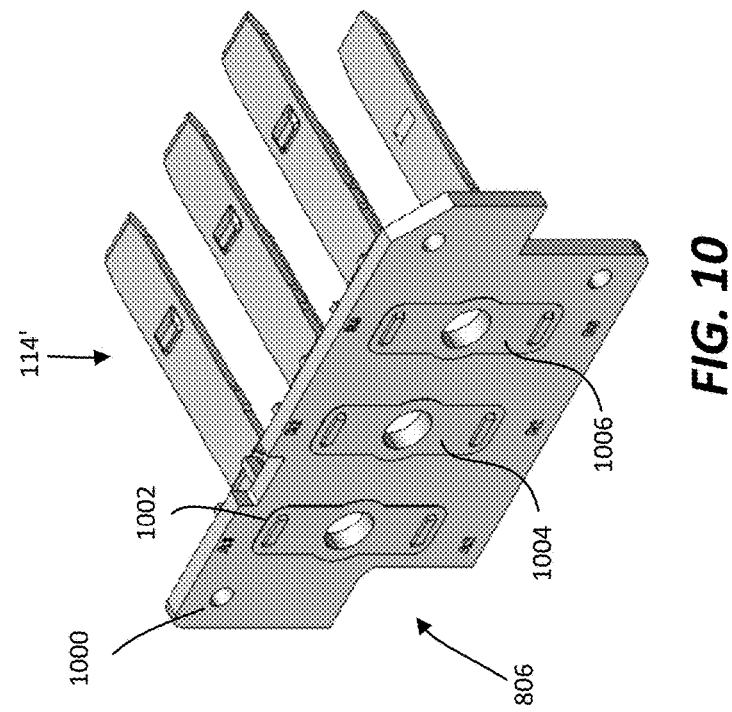
FIG. 10 is a perspective view of an example PCB assembly that may find use in a universal connector.

FIGS. 9 and 10 illustrate first and second embodiments 900, 1000 of a PCB type for three-terminal input. Both embodiments of the three-terminal PCB type 900, 1000 are configured to be electrically coupled to six contacts 114 or 114' and three power or data terminals 136. Each embodiment of the three-terminal PCB type 900, 1000 includes a first electrically conductive feature set 902, 1002 that electrically couples two contacts to a first terminal, a second electrically conductive feature set 904, 1004 that electrically couples two other contacts to a second terminal, and a third electrically-conductive feature set 906, 1006 that electrically couples the final two contacts to a third terminal. The first three-terminal type PCB further includes a contact, terminal 908, and electrically-conductive features 910 for ground. In contrast, the second three-terminal type PCB 1000 includes a cutout 806 on the PCB. A ground wire, contact, or other ground connection may bypass the PCB through the cutout 806.

Figure 11:
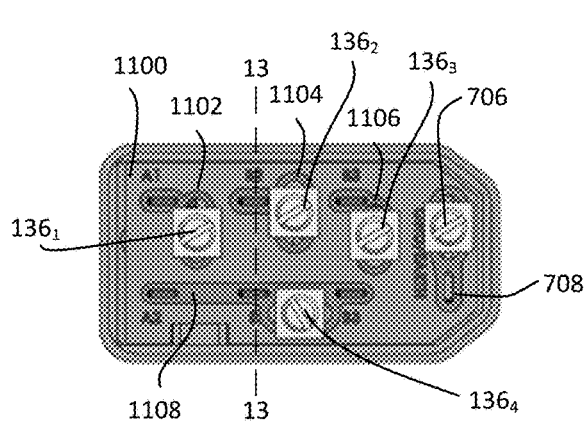
FIG. 11 is an end view of an example PCB assembly that may find use in a universal connector.
Figure 12:
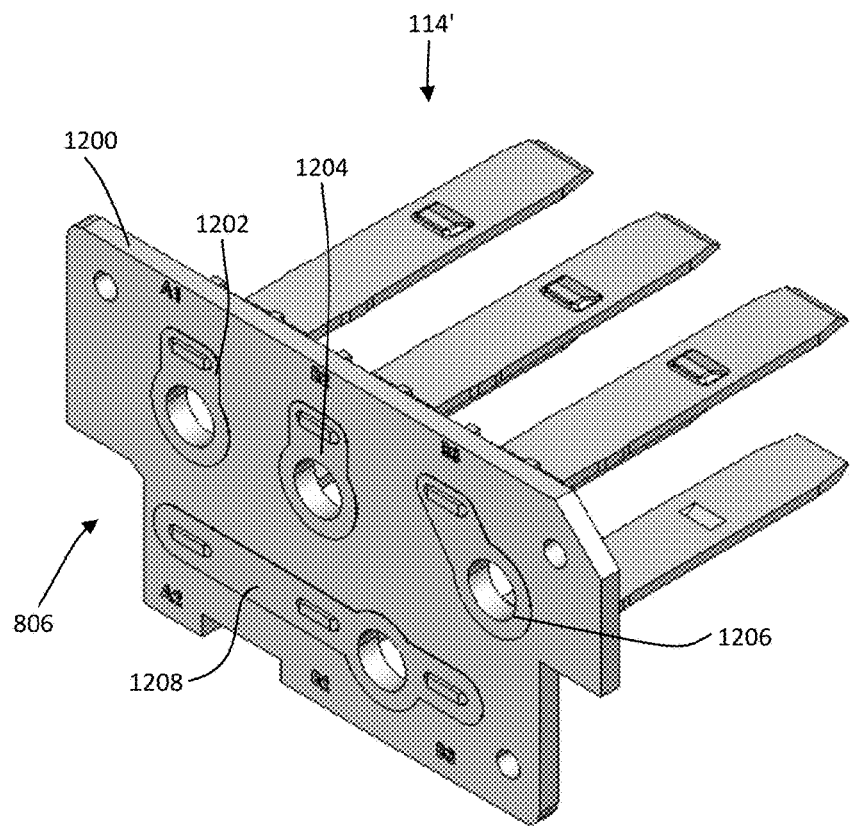
FIG. 12 is a perspective view of an example PCB assembly that may find use in a universal connector.

FIGS. 11 and 12 illustrate first and second embodiments 1100, 1200 of a PCB type for four-terminal input. Both embodiments of the four-terminal PCB type 1100, 1200 are configured to be electrically coupled to six contacts 114 or 114' and four power or data terminals 136. Each embodiment of the four-terminal PCB type 1100, 1200 includes a first electrically conductive feature set 1102, 1202 that electrically couples one contact 114, 114' to a first terminal $136_1$, a second electrically conductive feature set 1104, 1204 that electrically couples a second contact 114, 114' to a second terminal $136_2$, a third electrically-conductive feature set 1106, 1206 that electrically couples a third contact 114, 114' to a third terminal $136_3$, and a fourth electrically-conductive feature set 1108, 1208 that electrically couples the remaining three contacts 114, 114' to a fourth terminal $136_4$. The first four-terminal type PCB 1100 further includes a contact, terminal 706, and electrically-conductive features 708 for ground. In contrast, the second four-terminal type PCB 1200 includes a cutout 806 on the PCB. A ground wire, contact, or other ground connection that may bypass the PCB through the cutout 806.

Figure 13:
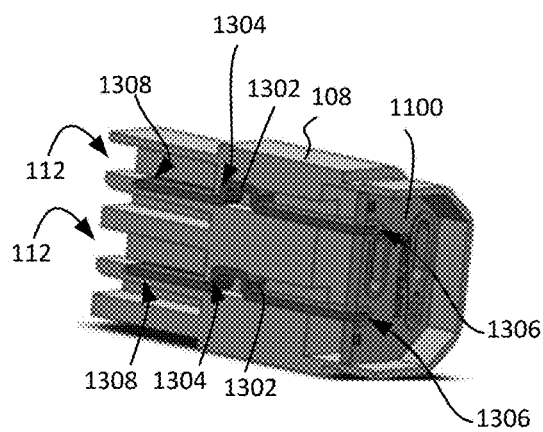
FIG. 13 is a cross-sectional view of the PCB assembly of FIG. 11, taken along line 13-13 in FIG. 11.

FIG. 13 is a cross-sectional view of an assembly including the first four-terminal PCB 1100, taken along line 13-13 in FIG. 11. Each contact 114 may include a longitudinal jog 1302. The jog 1302 may abut a vertical internal surface 1304 of the plug body 108 and may help to prevent longitudinal movement of the contact 114 in the assembled connector. Each contact 114 may be inserted through a portion (up to and including the entirety) of an aperture 1306 in the PCB 1100. The aperture 1306 may be configured to receive the contact 114 and may include a portion of an electrically-conductive feature set that electrically couples the contact 114 to a terminal 136. The plug body 108 may define, for each contact 114, a groove 1308 within each C-shaped recess 112, the groove 1308 configured to receive a portion of the contact 114 that is accessible for electrical connection with a meting connector. The groove 1308 may be sized and shaped so that the accessible surface of the contact 114 is flush with a front lip of the plug body 108.

Figure 14:
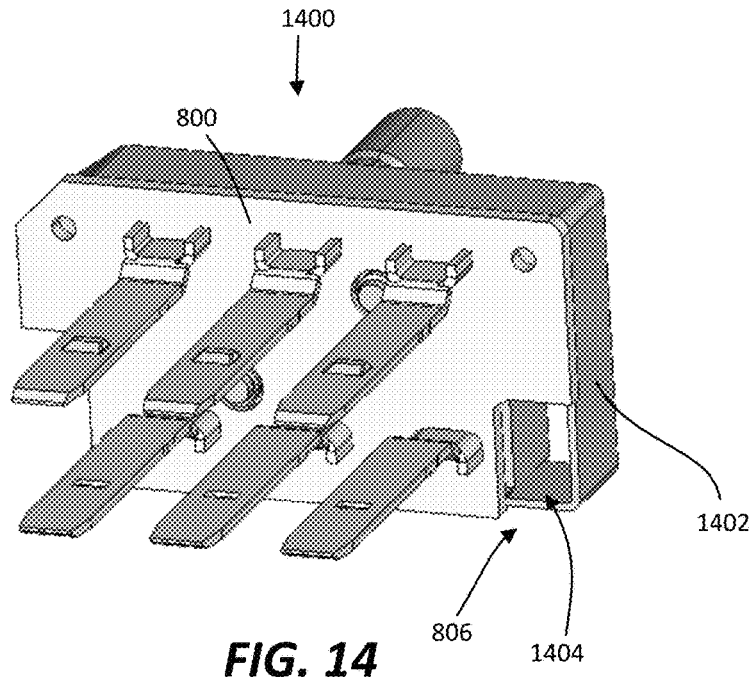
FIG. 14 is a perspective view of an example universal connector assembly.

FIG. 14 is a rear perspective view of the internal assembly 1400 of a two-terminal connector having the second two-terminal PCB 800 shown in FIG. 8. The insulating cover 1402 of the connector assembly may include an aperture 1404 that, in the assembled connector, aligns with the cutout on the PCB 806 for ground wire bypass.

Figure 15:
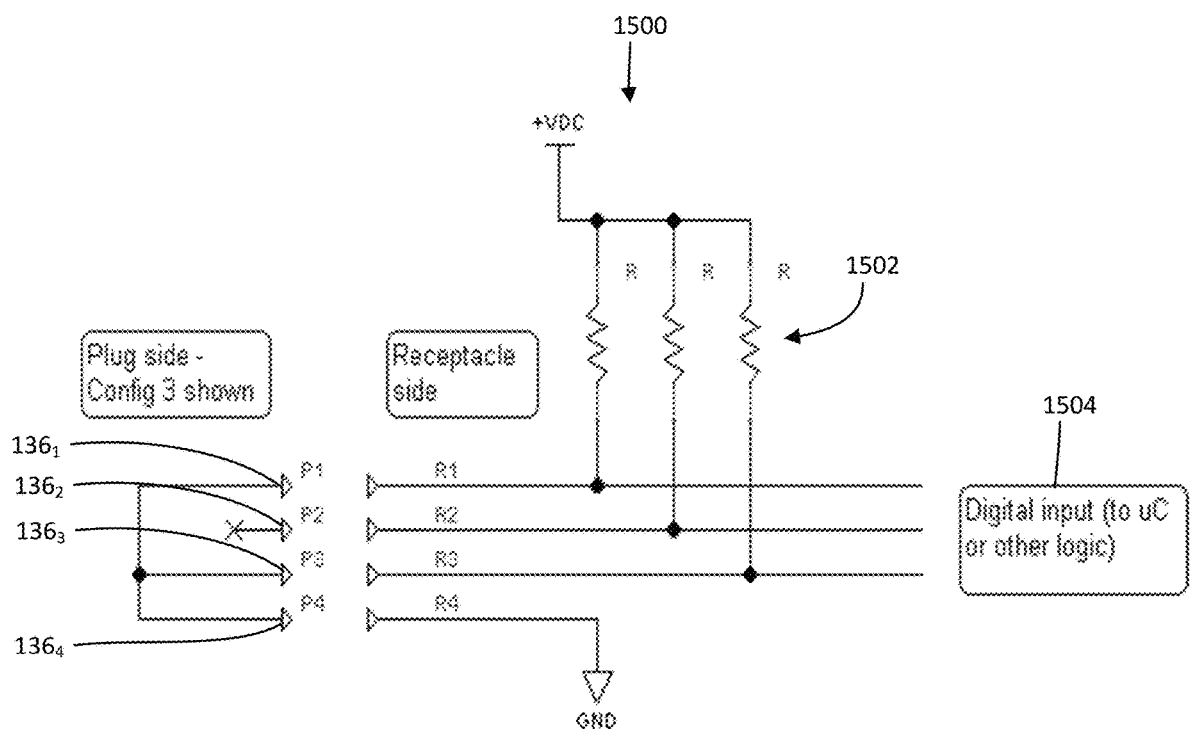
FIG. 15 is a circuit schematic illustrating an example arrangement of a connector for digital data transmission.

As noted above, the connector system may be used to transmit power and/or data. FIG. 15 is a circuit schematic illustrating an example arrangement 1500 of a connector for digital data transmission. The arrangement 1500 illustrated in FIG. 15 may find use with a four-terminal connector system (e.g., utilizing the PCB type 900, 1000 illustrated in FIGS. 9 and 10).

The data transmission arrangement 1500 may include use of three terminals $136_1$, $136_2$, $136_3$ for data transmission and a fourth terminal $136_4$ connected to ground. Of the three terminals $136_1$, $136_2$, $136_3$ for data transmission, a first terminal $136_1$ and third terminal $136_3$ and associated first transmission line and third transmission line may be used for signal transmission, and a second transmission line may be used for a neutral voltage. In the receiving connector, pull-up resistors 1502 may be coupled to the first, second, and third terminal lines $136_1$, $136_2$, $136_3$. A microcontroller, electronic control unit (ECU), or other processing unit 1504 may be coupled to the first, second, and third terminal lines of the receiving connector to read the data on the three transmission lines.

The schematic of FIG. 15 is just one example of a data transmission scheme that may find use with a connector system according to the present disclosure. Numerous other data transmission schemes are possible utilizing the universal connector plug bodies and use of PCB types to define the terminal layout and quantity according to the present disclosure.

Figure 16:
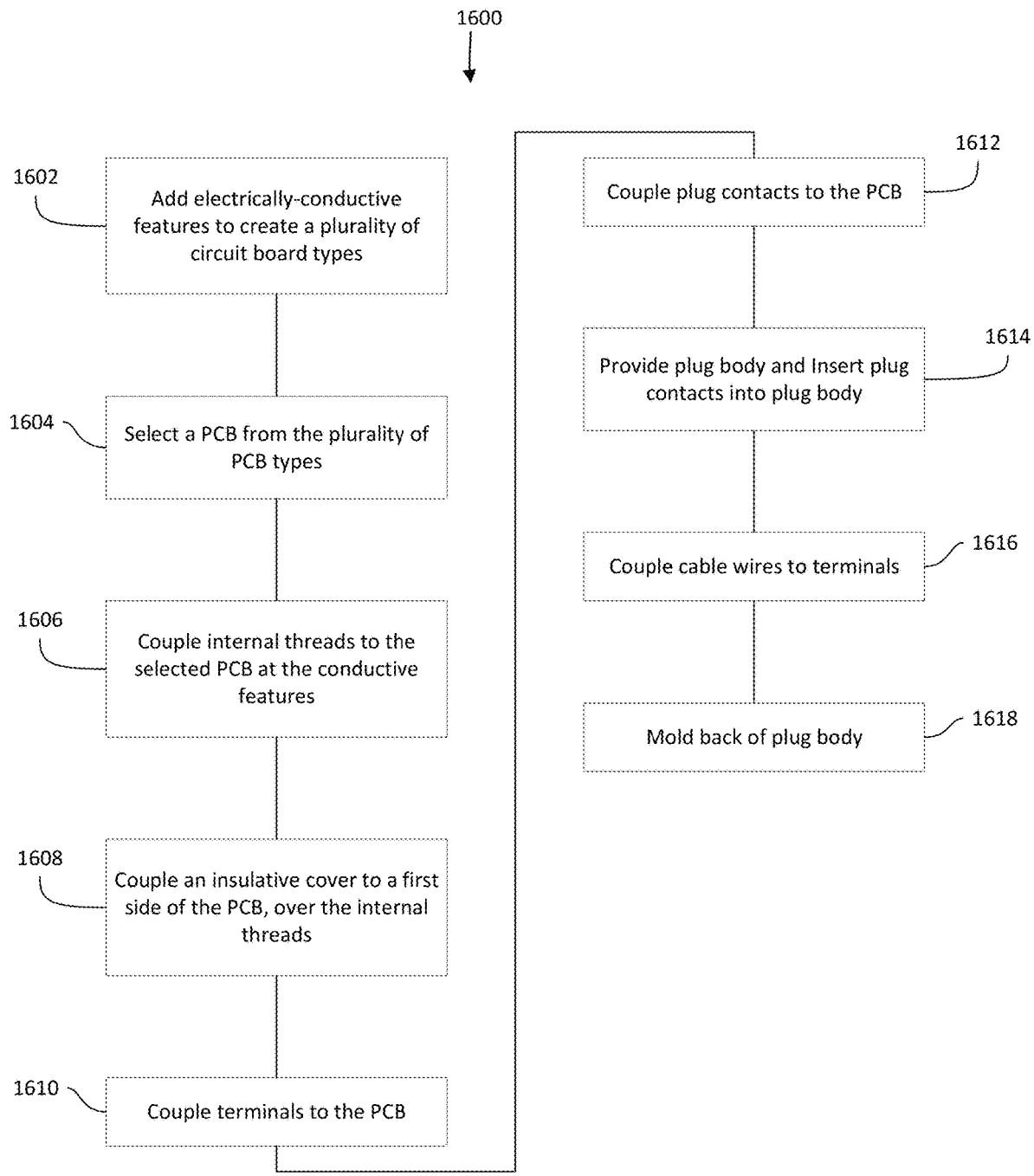
FIG. 16 is a flow chart illustrating an example method of manufacturing and assembling a universal connector.

FIG. 16 is a flow chart illustrating an example method 1600 of manufacturing and assembling an electrical connector. The method may be deployed, for example, to manufacture and assemble one of the connectors of FIG. 1-3, 5, or 13, utilizing PCB types and other components of this disclosure.

The method 1600 may include, at block 1602, adding electrically-conductive features on each of a plurality of circuit boards to define a plurality of circuit board types. Adding the electrically-conductive features may include printing wire traces, vias, pads, and other features on the circuit boards. The plurality of circuit board types may include a respective plurality of intended terminal quantities. The plurality of circuit boards may be identical (before printing) except for the quantity and configuration of apertures for vias and coupling of other components to the circuit board, and thus may be identical in size and shape. The plurality of circuit boards may each have an identical quantity and configuration of apertures for coupling plug contacts to the circuit board, as described below. The electrically-conductive features of each PCB may include a plurality of sets of electrically-conductive features, with each set electrically coupling one or more plug contact apertures with a single contact pad. Each PCB type may include a respective plurality of electrically-conductive features configured to electrically connect the plurality of electrical contacts to a respective plurality of terminals, and each PCB type may include a different quantity or layout of terminals from each other PCB type.

The method 1600 may further include, at block 1604, selecting a circuit board of a desired one of the plurality of circuit board types from among the plurality of circuit board types. The selected circuit board will be the subject of further assembly.

The method 1600 may further include, at block 1606, electrically a plurality of coupling pad connectors to the electrically conductive features of the selected PCB. Each pad connector may be electrically coupled to a contact pad of the PCB, in embodiments. The quantity of pad connectors may be equal to a quantity of terminals that will be provided on the connector. The pad connectors may be coupled to a rear side of the PCB, in some embodiments. The pad connectors may be internally threaded, in some embodiments. The pad connectors may be a surface mount type (SMT) and may be soldered to the PCB, in some embodiments.

The method 1600 may further include, at block 1608, coupling an insulative cover to the PCB. The insulative cover may be coupled to the rear side of the PCB. In some embodiments, the insulative cover may be coupled to the PCB over the pad connectors. The insulative cover may include a plurality of apertures through which the pad connectors may extend, in some embodiments. The insulative cover may have substantially the same shape as the PCB, in some embodiments, and thus may cover the entirety of the rear side of the PCB but for the pad connectors. The insulative cover may include an aperture, outside of the envelope of the PCB, for passage of a ground wire.

The method 1600 may further include, at block 1610, coupling a plurality of terminals to the PCB (e.g., to the electrically-conductive features of the PCB). In some embodiments, a respective terminal may be coupled to each pad connector. The terminals may be coupled to the pad connectors with fasteners, such as screws that are screwed into the internal threads of the pad connectors. Each terminal may be configured to receive one data or power wire, in embodiments.

The method 1600 may further include, at block 1612, coupling a plurality of plug contacts to the PCB. The quantity of plug contacts may be greater than the quantity of terminals, in some embodiments. Each terminal may be coupled to one to one or more of the plug contacts by the electrically-conductive features of the PCB, in some embodiments. The plug contacts may be coupled to a front side of the PCB. The plug contacts may be inserted into plug contact apertures in the PCB and soldered to the PCB, in some embodiments.

The method 1600 may further include, at block 1614, providing a universal plug body and coupling the plug contacts with the universal plug body. For example, the plug contacts may be inserted into the plug body. The universal plug body may be the same size and form regardless of the PCB type selected at block 1604. The universal plug body may include a plurality of recesses and/or protrusions, with a respective recess or protrusion for each plug contact. The universal plug body may further include a recess or protrusion for a ground contact, and block 1614 may include coupling the ground contact with the universal plug body such as by, for example, inserting ground contact into the plug body.

The method 1600 may further include, at block 1616, coupling a respective wire to each terminal. Each wire may be a data wire or power wire of the appropriate construction (e.g., gauge) for a desired application. The wires may be inserted into a cable body, or a cable body may be formed around the wires, in some embodiments. Block 1616 may further include coupling a ground wire to the ground wire contact and threading the ground wire through a ground wire aperture in the insulative cover. The ground wire may be coupled with the assembly without placing the ground wire in electrical contact with the PCB.

The method 1600 may further include, at block 1618, molding a connector body over the coupling of the wires to the terminals or otherwise coupling a connector body to the plug body.

Blocks 1604-1618 of the method 1600 may be repeated to assemble a variety of different connector types that utilize the same plug body.

Figure 17:
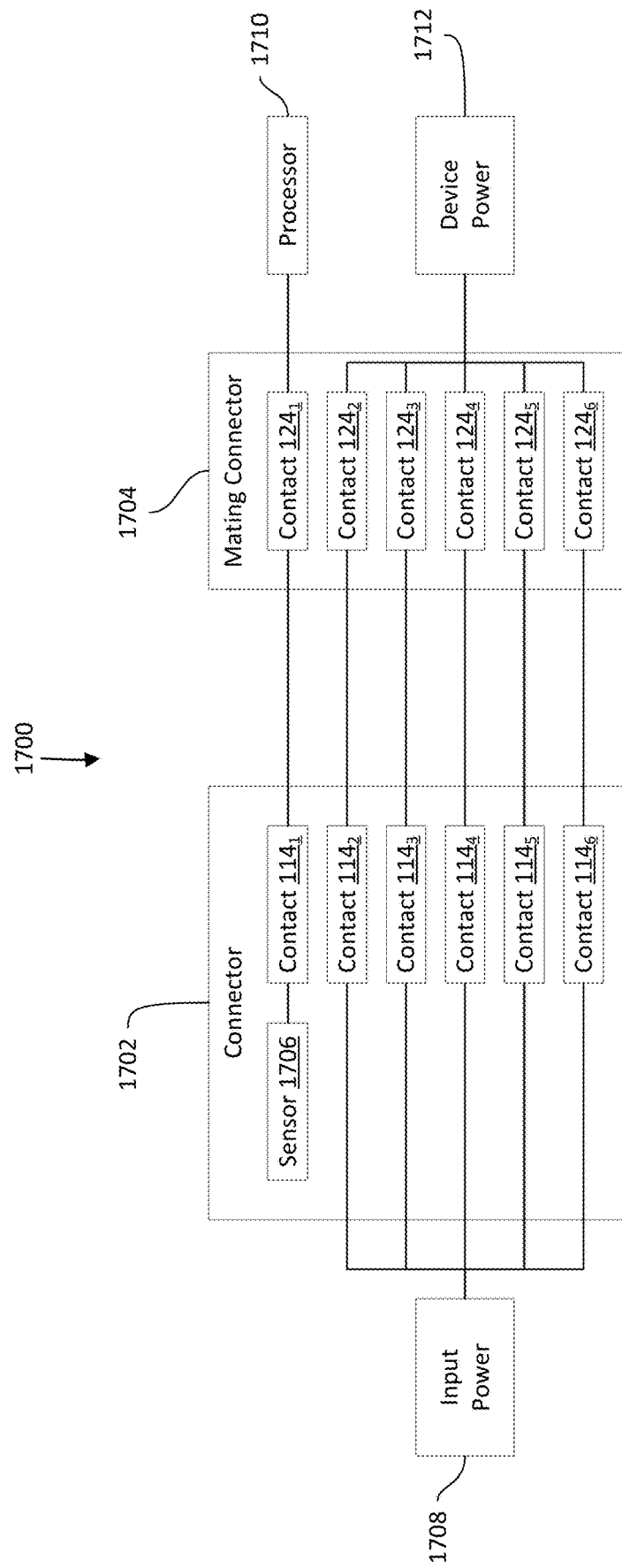
FIG. 17 is a block diagram illustrating an example universal connector system.

FIG. 17 is a block diagram view of an example universal connector system 1700. The connector system 1700 may include a first connector 1702 and a second connector 1704 that mates with the first connector 1702. The first connector 1702 may be identical to connector 102 or connector 102' except for the inclusion of a sensor 1706, as described below. The second connector may be connector 104, in some embodiments.

The connector 1702 may include six contacts $114_1$, $114_2$, $114_3$, $114_4$, $114_5$, $114_6$ and a sensor 1706. Five of the contacts $114_2$, $114_3$, $114_4$, $114_5$, $114_6$ may be electrically coupled to input power 1708 (e.g., through a PCB, as described herein). The sensor 1706 may be disposed within the plug body and may be electrically coupled to the sixth contact $114_1$. The sensor 1706 may be, for example, a thermistor or other sensor configured to output a signal indicative of a condition within the connector. The sensor 1706 may be coupled directly to the contact $114_1$, in some embodiments. In other embodiments, the sensor 1706 may be coupled to the contact $114_1$ through a PCB.

A first contact $124_1$ of the mating connector 1704 may output to a processor 1710, which processor 1710 may receive an output signal from the sensor 1706 and may analyze the signal to determine a condition of the connectors 1702, 1704. For example, where the sensor 1706 is a thermistor, the processor 1710 may analyze the output of the thermistor to determine if the connectors 1702, 1704 are in a thermal runaway or other overheated condition. The other contacts of the mating connector may provide device power 1712 to an electronic device. In some embodiments, the input power may power the processor 1710 (e.g., the processor 1710 may be a processor of the electronic device).

Figure 18:
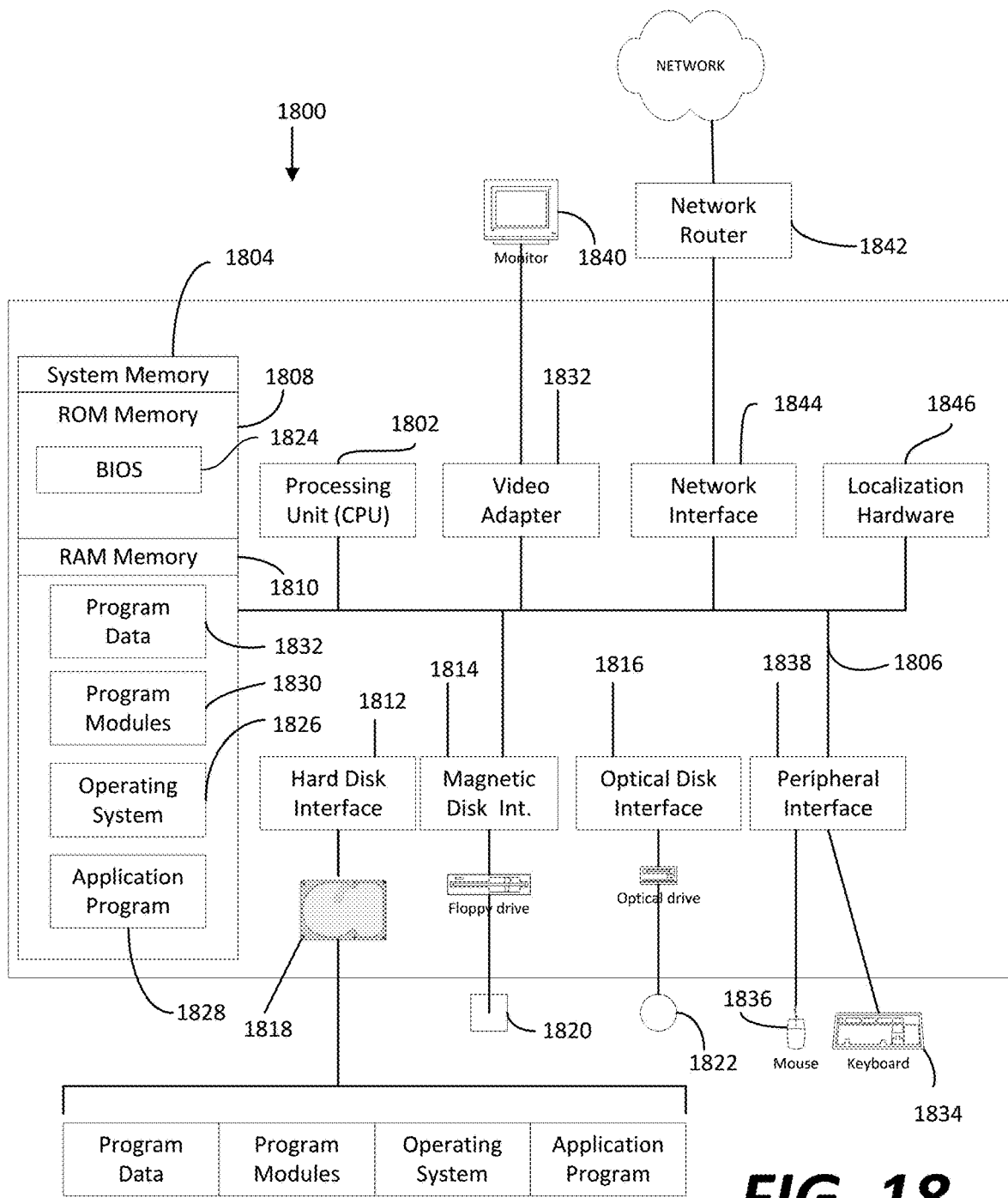
FIG. 18 is a diagrammatic view of an example embodiment of a user computing environment.

FIG. 18 is a diagrammatic view of an example of a user computing environment that includes a general-purpose computing system environment 1800, such as a desktop computer, laptop, smartphone, tablet, or any other such device having the ability to execute instructions, such as those stored within a non-transient, computer-readable medium. Various computing devices disclosed herein may be similar to the computing system 1800 or may include some components of the computing system 1800. For example, the connector system 1700 of FIG. 17 may include or may find use with one or more data servers or racks of data servers, which servers may include one or more of the computing components of the environment 1800. Furthermore, while described and illustrated in the context of a single computing system 1800, those skilled in the art will also appreciate that the various tasks described hereinafter may be practiced in a distributed environment having multiple computing systems 1800 linked via a local or wide-area network in which the executable instructions may be associated with and/or executed by one or more of multiple computing systems 1800.

In its most basic configuration, computing system environment 1800 typically includes at least one processing unit 1802 and at least one memory 1804, which may be linked via a bus 1806. Depending on the exact configuration and type of computing system environment, memory 1804 may be volatile (such as RAM 1810), non-volatile (such as ROM 1808, flash memory, etc.) or some combination of the two. Computing system environment 1800 may have additional features and/or functionality. For example, computing system environment 1800 may also include additional storage (removable and/or non-removable) including, but not limited to, magnetic or optical disks, tape drives and/or flash drives. Such additional memory devices may be made accessible to the computing system environment 1800 by means of, for example, a hard disk drive interface 1812, a magnetic disk drive interface 1814, and/or an optical disk drive interface 1816. As will be understood, these devices, which would be linked to the system bus 1806, respectively, allow for reading from and writing to a hard disk 1818, reading from or writing to a removable magnetic disk 120, and/or for reading from or writing to a removable optical disk 1822, such as a CD/DVD ROM or other optical media. The drive interfaces and their associated computer-readable media allow for the nonvolatile storage of computer readable instructions, data structures, program modules and other data for the computing system environment 1800. Those skilled in the art will further appreciate that other types of computer readable media that can store data may be used for this same purpose. Examples of such media devices include, but are not limited to, magnetic cassettes, flash memory cards, digital videodisks, Bernoulli cartridges, random access memories, nano-drives, memory sticks, other read/write and/or read-only memories and/or any other method or technology for storage of information such as computer readable instructions, data structures, program modules or other data. Any such computer storage media may be part of computing system environment 1800.

A number of program modules may be stored in one or more of the memory/media devices. For example, a basic input/output system (BIOS) 1824, containing the basic routines that help to transfer information between elements within the computing system environment 1800, such as during start-up, may be stored in ROM 1808. Similarly, RAM 1810, hard drive 1818, and/or peripheral memory devices may be used to store computer executable instructions comprising an operating system 1826, one or more applications programs 1828 (which may include temperature detecting or other sensor reading functionality disclosed herein, for example), other program modules 1830, and/or program data 1822. Still further, computer-executable instructions may be downloaded to the computing environment 1800 as needed, for example, via a network connection.

An end-user may enter commands and information into the computing system environment 1800 through input devices such as a keyboard 1834 and/or a pointing device 1836. While not illustrated, other input devices may include a microphone, a joystick, a game pad, a scanner, etc. These and other input devices would typically be connected to the processing unit 1802 by means of a peripheral interface 1838 which, in turn, would be coupled to bus 1806. Input devices may be directly or indirectly connected to processor 1802 via interfaces such as, for example, a parallel port, game port, firewire, or a universal serial bus (USB). To view information from the computing system environment 1800, a monitor 1840 or other type of display device may also be connected to bus 1806 via an interface, such as via video adapter 1832. In addition to the monitor 1840, the computing system environment 1800 may also include other peripheral output devices, not shown, such as speakers and printers.

The computing system environment 1800 may also utilize logical connections to one or more computing system environments. Communications between the computing system environment 1800 and the remote computing system environment may be exchanged via a further processing device, such a network router 1842, that is responsible for network routing. Communications with the network router 1842 may be performed via a network interface component 1844. Thus, within such a networked environment, e.g., the Internet, World Wide Web, LAN, or other like type of wired or wireless network, it will be appreciated that program modules depicted relative to the computing system environment 1800, or portions thereof, may be stored in the memory storage device(s) of the computing system environment 1800.

The computing system environment 1800 may also include localization hardware 1846 for determining a location of the computing system environment 1800. In some instances, the localization hardware 1846 may include, for example only, a GPS antenna, an RFID chip or reader, a WiFi antenna, or other computing hardware that may be used to capture or transmit signals that may be used to determine the location of the computing system environment 1800.

While this disclosure has described certain embodiments, it will be understood that the claims are not intended to be limited to these embodiments except as explicitly recited in the claims. On the contrary, the instant disclosure is intended to cover alternatives, modifications and equivalents, which may be included within the spirit and scope of the disclosure. Furthermore, in the detailed description of the present disclosure, numerous specific details are set forth in order to provide a thorough understanding of the disclosed embodiments. However, it will be obvious to one of ordinary skill in the art that systems and methods consistent with this disclosure may be practiced without these specific details. In other instances, well known methods, procedures, components, and circuits have not been described in detail as not to unnecessarily obscure various aspects of the present disclosure.

Some portions of the detailed descriptions of this disclosure have been presented in terms of procedures, logic blocks, processing, and other symbolic representations of operations on data bits within a computer or digital system memory. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic data capable of being stored, transferred, combined, compared, and otherwise manipulated in a computer system or similar electronic computing device. For reasons of convenience, and with reference to common usage, such data is referred to as bits, values, elements, symbols, characters, terms, numbers, or the like, with reference to various presently disclosed embodiments.

It should be borne in mind, however, that these terms are to be interpreted as referencing physical manipulations and quantities and are merely convenient labels that should be interpreted further in view of terms commonly used in the art. Unless specifically stated otherwise, as apparent from the discussion herein, it is understood that throughout discussions of the present embodiment, discussions utilizing terms such as "determining" or "outputting" or "transmitting" or "recording" or "locating" or "storing" or "displaying" or "receiving" or "recognizing" or "utilizing" or "generating" or "providing" or "accessing" or "checking" or "notifying" or "delivering" or the like, refer to the action and processes of a computer system, or similar electronic computing device, that manipulates and transforms data. The data is represented as physical (electronic) quantities within the computer system's registers and memories and is transformed into other data similarly represented as physical quantities within the computer system memories or registers, or other such information storage, transmission, or display devices as described herein or otherwise understood to one of ordinary skill in the art.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. An electrical connector comprising:
a plug body;
a plurality of electrical contacts disposed in the plug body;
a printed circuit board (PCB), coupled with the plug body, comprising a plurality of electrically-conductive features configured to electrically connect the plurality of electrical contacts to a plurality of terminals; and
a ground electrical contact, disposed in the plug body, that is not in electrical contact with the PCB.

2. The electrical connector of claim 1, wherein the PCB is a PCB type selected from a plurality of PCB types, each PCB type comprising a respective plurality of electrically-conductive features configured to electrically connect the plurality of electrical contacts to a respective plurality of terminals, wherein each PCB type comprises a different quantity or layout of terminals from each other PCB type.

3. The electrical connector of claim 1, further comprising the plurality of terminals, electrically coupled to the electrically-conductive features of the PCB.

4. The electrical connector of claim 1, wherein the electrically-conductive features electrically couple a first one of the terminals to a first two or more of the electrical contacts.

5. The electrical connector of claim 4, wherein one or more of:
the electrically-conductive features electrically couple a second one of the terminals to a second two or more of the electrical contacts; or
the electrically-conductive features electrically couple a second one of the terminals to one of the electrical contacts that is not in the two or more electrical contacts.

6. The electrical connector of claim 1, further comprising an electrically-insulative cover coupled to the PCB, wherein the electrical contacts are coupled to the PCB at a first side of the PCB and the cover is coupled to a second side of the PCB that is opposite the first side.

7. The electrical connector of claim 1, further comprising a fastener, disposed on an external surface of the connector, for affixing the connector to a mating connector.

8. The electrical connector of claim 1, wherein each electrical contact is disposed in a respective C-shaped recess in the plug body.

9. A method of assembling an electrical connector, the method comprising:
providing a plug body;
inserting a plurality of electrical contacts into the plug body;
selecting a printed circuit board (PCB) from a plurality PCB of a plurality of PCB types, each PCB type comprising a respective plurality of electrically-conductive features configured to electrically connect the plurality of electrical contacts to a respective plurality of terminals, wherein each PCB type comprises a different quantity or layout of terminals from each other PCB type;
coupling the plurality of electrical contacts with the electrically-conductive features of the selected PCB; and
coupling an electrically-insulative cover to the PCB, wherein the electrical contacts are coupled to the PCB at a first side of the PCB and the cover is coupled to a second side of the PCB that is opposite the first side.

10. The method of claim 9, further comprising coupling the plurality of terminals to the electrically-conductive features of the PCB.

11. The method of claim 9, wherein the electrically-conductive features electrically couple a single one of the terminals to two or more of the electrical contacts.

12. The method of claim 11, wherein one or more of:
the electrically-conductive features electrically couple a second one of the terminals to a second two or more of the electrical contacts; or
the electrically-conductive features electrically couple a second one of the terminals to one of the electrical contacts that is not in the two or more electrical contacts.

13. The method of claim 9, further comprising:
inserting a ground electrical contact into the plug body, wherein the ground electrical contact is not placed in electrical contact with the PCB; and
coupling a ground wire with the ground electrical contact.

14. An electrical connector system comprising:
a first connector comprising:
a first plug body;
a first plurality of electrical contacts disposed in the first plug body; and
a first printed circuit board (PCB), coupled with the first plurality of electrical contacts, comprising a first plurality of electrically-conductive features configured to electrically connect the first plurality of electrical contacts to a first plurality of terminals; and
a second connector comprising:
a second plug body that is identical to the first plug body;
a second plurality of electrical contacts disposed in the second plug body; and
a second PCB, coupled with the second plurality of electrical contacts, comprising a second plurality of electrically-conductive features configured to electrically connect the second plurality of electrical contacts to a second plurality of terminals, wherein one or more of:
the second plurality of terminals is different in number than the first plurality of terminals; or
the second plurality of electrically-conductive features is different in configuration than the first plurality of electrically-conductive features;
wherein each of the first plug body and the second plug body comprises a respective plurality of C-shaped recesses, wherein each of the first and second plurality of electrical contacts is disposed in a respective C-shaped recess.

15. The electrical connector system of claim 14, further comprising:
a mating connector, configured to mate, separately, with both the first connector and the second connector.

16. The connector system of claim 15, wherein the mating connector is configured to be secured, separately, to the first connector and the second connector with one or more captive screws or an integrated latch.

17. The electrical connector system of claim 14, further comprising a third connector comprising:
a third plug body that is identical to the first plug body;
a third plurality of electrical contacts disposed in the third plug body; and
a third PCB, coupled with the third plurality of electrical contacts, comprising a third plurality of electrically-conductive features configured to electrically connect the third plurality of electrical contacts to a third plurality of terminals, wherein one or more of:

the third plurality of terminals is different in number than the first and second pluralities of terminals; or the third plurality of electrically-conductive features is different in configuration than the first and second pluralities of electrically-conductive features.

* * * * *